US008766183B2

(12) United States Patent
Fukuda et al.

(10) Patent No.: US 8,766,183 B2
(45) Date of Patent: Jul. 1, 2014

(54) CHARGED PARTICLE BEAM DEVICE

(75) Inventors: Muneyuki Fukuda, Kokubunji (JP);
Hiromasa Yamanashi, Sagamihara (JP);
Yasunari Sohda, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 98 days.

(21) Appl. No.: 13/058,712

(22) PCT Filed: Sep. 10, 2009

(86) PCT No.: PCT/JP2009/004506
§ 371 (c)(1),
(2), (4) Date: Feb. 11, 2011

(87) PCT Pub. No.: WO2010/035416
PCT Pub. Date: Apr. 1, 2010

(65) Prior Publication Data
US 2011/0147586 A1 Jun. 23, 2011

(30) Foreign Application Priority Data
Sep. 26, 2008 (JP) ................................. 2008-247001

(51) Int. Cl.
*H01J 3/12* (2006.01)
*H01J 37/153* (2006.01)
(52) U.S. Cl.
USPC .......................................... 250/310; 250/311
(58) Field of Classification Search
USPC ................... 250/306, 307, 310, 311
See application file for complete search history.

(56) References Cited

U.S. PATENT DOCUMENTS

| 5,952,667 A * | 9/1999 | Shimizu ..................... 250/492.2 |
| 6,825,480 B1 * | 11/2004 | Watanabe et al. .......... 250/491.1 |
| 2003/0006371 A1 | 1/2003 | Watanabe et al. |
| 2005/0236570 A1 * | 10/2005 | Morokuma et al. .......... 250/311 |

(Continued)

FOREIGN PATENT DOCUMENTS

| JP | 8-195345 A | 7/1996 |
| JP | 2002-134059 A | 5/2002 |

(Continued)

OTHER PUBLICATIONS

International Search Report including English translation dated Oct. 20, 2009 (Six (6) pages).
Japanese Office Action dated Jan. 15, 2013 including English-language translation (Eight (8) pages).

*Primary Examiner* — Jack Berman
*Assistant Examiner* — David E Smith
(74) *Attorney, Agent, or Firm* — Crowell & Moring LLP

(57) ABSTRACT

The astigmatism control processing time is decreased to 1 second or less by improving the astigmatic difference measurement accuracy. A charged particle beam device includes: a stage on which a sample is loaded; a transport mechanism which carries the sample onto the stage; a charged particle beam optical system which irradiates the sample on the stage with a charged particle beam and detects secondary charged particles generated from the sample; and a controller which determines setup parameters for the charged particle beam optical system and controls the charged particle beam optical system. The controller registers and holds electro-optical system setup parameters for irradiation with a beam tilted from a normal line on the sample as the charged particle beam, compares observation images obtained by the tilted beam, measures the amount and direction of movement and calculates the amount of astigmatism correction from the amount of movement and the direction.

17 Claims, 9 Drawing Sheets

(56) References Cited

U.S. PATENT DOCUMENTS

2006/0043293 A1* 3/2006 Doi et al. ............... 250/310
2006/0060781 A1* 3/2006 Watanabe et al. ......... 250/310
2006/0289751 A1   12/2006 Watanabe et al.

FOREIGN PATENT DOCUMENTS

| | | | |
|---|---|---|---|
| JP | 2003-16983 A | | 1/2003 |
| JP | 2004-146192 A | | 5/2004 |
| JP | 2004146192 A | * | 5/2004 |

\* cited by examiner

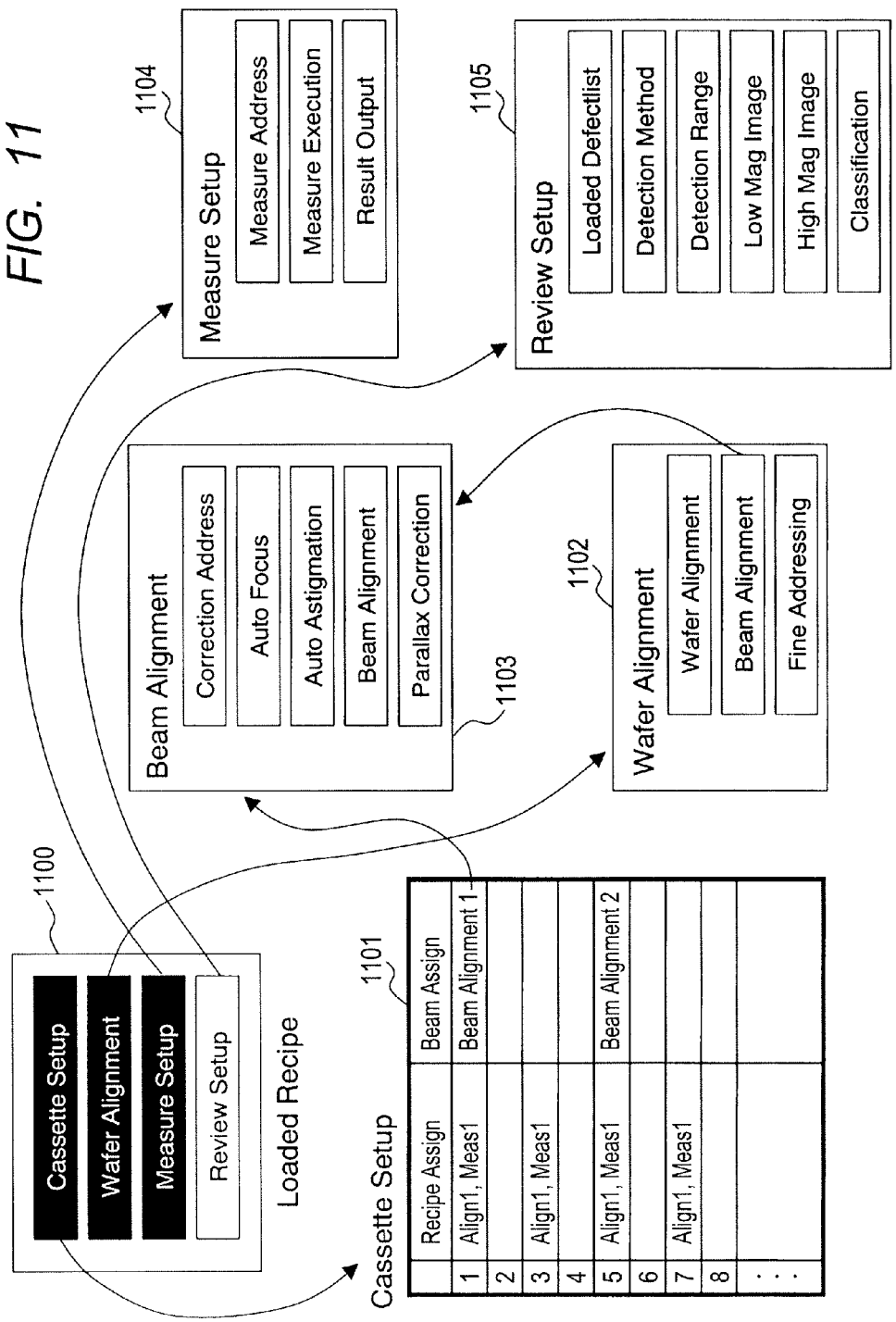

CHARGED PARTICLE BEAM DEVICE

TECHNICAL FIELD

The present invention relates to charged particle beam devices which measure the shape and size of a fine pattern on the surface of a sample (semiconductor wafer, reticle, etc).

BACKGROUND ART

A charged particle beam device is available as a technique of observing a circuit pattern formed on a sample such as a semiconductor wafer. The charged particle beam device irradiates a sample with a primary charged particle beam and detects secondary charged particles generated thereby. The detected secondary charged particles are converted into an image which is shown on a display unit. If the primary charged particle beam is an electron beam, the device is a scanning electron microscope (hereinafter abbreviated as SEM). First, electrons emitted from a heating type or field emission type electron source are accelerated. Then, an electron beam whose diameter is decreased by a lens is formed. By scanning a sample (for example, a wafer, reticle, etc) two-dimensionally with the electron beam and detecting the generated secondary electrons, a two-dimensional scanned electron image of a fine pattern on the sample is obtained.

At this time, depending on the landing energy of primary electrons onto the sample, the penetration of electrons into the sample will spread deep, resulting in deterioration of the resolution of the image obtained by detection of secondary electrons. Therefore, the landing energy must be decreased. Furthermore, among the materials used in the process, the number of materials susceptible to an electron beam is increasing. For this reason, it is indispensable to decrease the energy of incident electrons. In addition, since the efficiency of generation of secondary electrons varies depending on the landing energy of incident electrons onto the sample, charge-up of the sample occurs. Therefore, the landing energy must be selected appropriately to keep the efficiency of generation of secondary electrons constant. In order to resolve all the problems related to resolution, susceptibility to an electron beam, and charge-up, it is essential to decrease the energy.

The use of a length measuring SEM (Critical-Dimension Scanning Electron Microscope, hereinafter abbreviated as CD-SEM) is the mainstream of dimensional measurement of semiconductor device patterns. With the recent tendency toward the miniaturization of circuit patterns, high resolution is demanded. A mechanism in which after generation of electrons from the electron source, the electrons are accelerated and before the electrons enter the sample, a decelerating electric field is applied (application of a retarding voltage) is provided. This makes it possible to achieve both high resolution of an obtained image and low acceleration of landing energy.

However, recently among samples to be measured, electrostatically charged samples or samples which become electrostatically charged by beam irradiation have been emerging and due to the electrostatic charge of the sample or its distribution, a focusing error or astigmatism occurs in the CD-SEM. This kind of electrostatic charge may distort the trajectory of the primary charged particle beam to irradiate the sample or if the primary charged particle beam is converged by an electromagnetic lens, it may displace the focal point on the sample surface. This requires time to adjust the electromagnetic lens and the like for focus position and astigmatic readjustments. Furthermore, if the abovementioned electrostatic charge has an in-plane distribution on the sample, focus position and astigmatic readjustments are required each time the point of irradiation with the primary charged particle beam moves to each measuring point on the sample. As a consequence, throughput is remarkably decreased in the measurement and inspection of fine patterns with the charged particle beam of a CD-SEM or the like.

As a solution to this problem, Patent Document 1 discloses a technique which measures, by image processing, the astigmatic difference (range finding between astigmatic focal lengths) based on the distance between two points at which the contrast of differential images in perpendicular directions at different focus positions is the maximum. Patent Document 2 discloses a technique which finds a point at which the amount of movement for defocusing is the minimum, by making an astigmatism correction in a perpendicular direction with respect to the axial beam.

PRIOR ART DOCUMENTS

Patent Document

Patent Document 1: Japanese Patent Application Laid-Open publication No. 2003-16983
Patent Document 2: Japanese Patent Application Laid-Open Publication No. 2002-134059

SUMMARY OF THE INVENTION

Problem to be Solved by the Invention

According to Patent Document 1, for the measurement of astigmatic difference, it is necessary to obtain tens of images and compare them. For that purpose, in the case of using a scanning electron microscope for observation with several pA to several tens of pA, processing time of 3-10 seconds is required. On the other hand, according to Patent Document 2, the sensitivity of the amount of movement for defocusing to astigmatic difference is low, so accuracy insufficiency is more likely to occur than in the correction method according to Patent Document 1.

An object of the present invention is to provide a charged particle beam device which can shorten the measuring time without a decrease in the astigmatic difference measurement sensitivity.

Means for Solving the Problem

In order to address the above problem, the present invention provides a charged particle beam device characterized by including, for the measurement of the amount and direction of movement by comparison of observation images obtained by irradiation beams in two directions, a memory for registering and holding electro-optical system setup parameters for irradiation with a beam tilted from a normal line on a sample and a processing section for comparing the observation images obtained by the tilted beam, measuring the amount and direction of movement and calculating an amount of astigmatism correction from the amount of movement and the direction.

The probe shape of a charged particle beam is not point-like if the focal point position differs from one azimuth angle to another. Here, the difference in focal point position between two straight azimuth directions is an astigmatic difference (range finding between astigmatic focal lengths). When there is such an astigmatic difference and the electron beam is tilted in a desired direction for astigmatic measurement with respect to the focal point position, visual field shift occurs. The amount of visual field shift is proportional to the astigmatic difference. In order to suppress astigmatism, it is necessary to measure the direction in which astigmatism occurs and its amount and control them. To this end, it is necessary to measure the astigmatic difference between two azimuth angles 0 and 45 degrees from a reference azimuth direction in the sample plane and calculate the direction and amount of astigmatism to calculate the amount of control of a stigmator. It is also useful to provide at least one stigmator inside the objective lens and at least one outside the objective lens. In this case, correction of astigmatism on the sample by a stigmator inside the objective lens is effective. Furthermore, it is desirable to provide means for calculating astigmatism from the pattern edge sharpness of the image.

Effect of the Invention

According to the present invention as mentioned above, the sample potential (retarding voltage) range for focal point detection can be narrowed by improving the accuracy of surface electrostatic potential distribution prediction. Particularly, in the case of a wafer whose potential distribution is not rotationally symmetric, the retarding voltage range can be effectively narrowed. As a consequence, auto focusing time can be reduced to 1/10 or less. Also, by using plural stigmators, device-induced astigmatism and sample-induced astigmatism can be measured and corrected individually, contributing to improvement in correction accuracy.

BRIEF DESCRIPTION OF THE DRAWINGS

[FIG. 11] is a view which schematically shows an example of the configuration of an input screen shown on the user interface 202 of the system according to each embodiment.

MODES FOR CARRYING OUT THE INVENTION

Next, embodiments of the present invention will be described referring to drawings.

Figure 1:
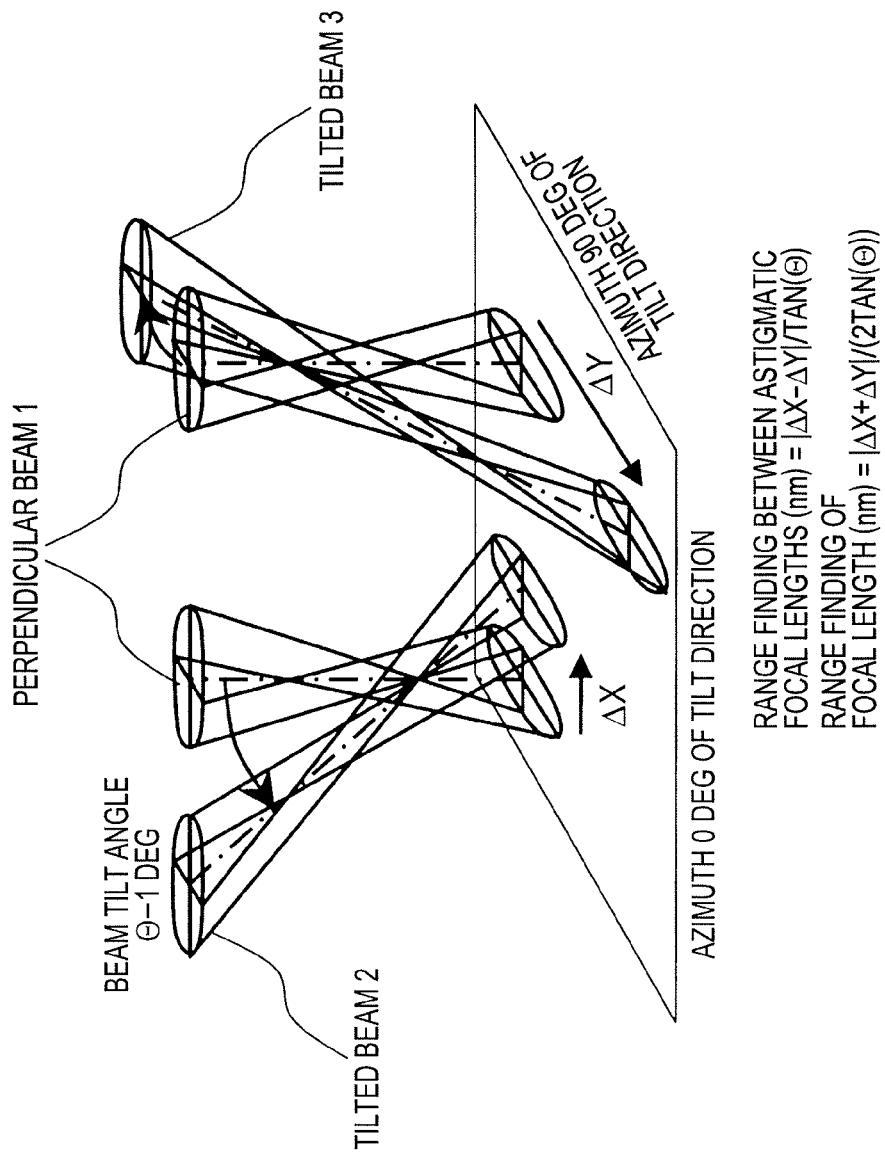
[FIG. 1] is a schematic view illustrating means to emphasize astigmatism by a parallax method according to the present invention.

FIG. 1 is a schematic view showing how astigmatism of an electron beam is emphasized by a parallax method. In the figure, 1 denotes a perpendicular beam, namely an electron beam in a normal direction of an X-Y plane and 2 and 3 denote tilted beams, namely electron beams with a tilt angle (not zero) with respect to the above normal direction. The probe shape of the tilted electron beams, namely tilted beams 2 and 3, is not point-like. Here, the difference in focal point position between two straight azimuth directions, namely azimuth angles 0 degree and 90 degrees, is an astigmatic difference or range finding between astigmatic focal lengths. The astigmatic difference (range finding between astigmatic focal lengths) (nm) is expressed by $|\Delta X - \Delta Y|/TAN(\theta)$. The range finding of focal length (nm) is $|\Delta X + \Delta Y|/2\, TAN(\theta)$. However, even if there is a difference between beam tilt angles $\theta$ of the tilted beams 2 and 3, astigmatic differences can be expressed as follows: assuming that $\theta_x$ and $\theta_y$ denote the beam tilt angles in their respective directions, the range finding between astigmatic focal lengths (nm) is $|\Delta X/TAN(\theta_x) - Y/TAN(\theta_y)|$ and the range finding of focal length (nm) is $|\Delta X/TAN(\theta_x) + \Delta Y/TAN(\theta_y)|/2$. Assuming that $\alpha_x$ and $\alpha_y$ denote the azimuth angle differences at azimuth angles 0 and 90 degrees, the range finding between astigmatic focal lengths (nm) is $|\Delta X/\cos(\alpha_x)/TAN(\theta_x) - \Delta Y/\cos(\alpha_y)/TAN(\theta_y)|$.

When there is an astigmatic difference as mentioned above and the electron beam is tilted in a desired direction for astigmatic measurement with respect to the focal point position, visual field shift occurs. The amount of visual field shift is proportional to the astigmatic difference. In order to suppress astigmatism, it is necessary to measure the direction in which astigmatism occurs and its amount and control them. To this end, in the present invention, the astigmatic differences between two azimuth angles 0 and 90 degrees and between 45 and 135 degrees from a reference direction in the sample plane are measured and the direction of astigmatism and its amount are calculated to calculate the amount of astigmatism correction as the amount of control of the stigmator. A concrete example of such calculations is detailed in the descriptions of embodiments given below.

First Embodiment

Figure 2:
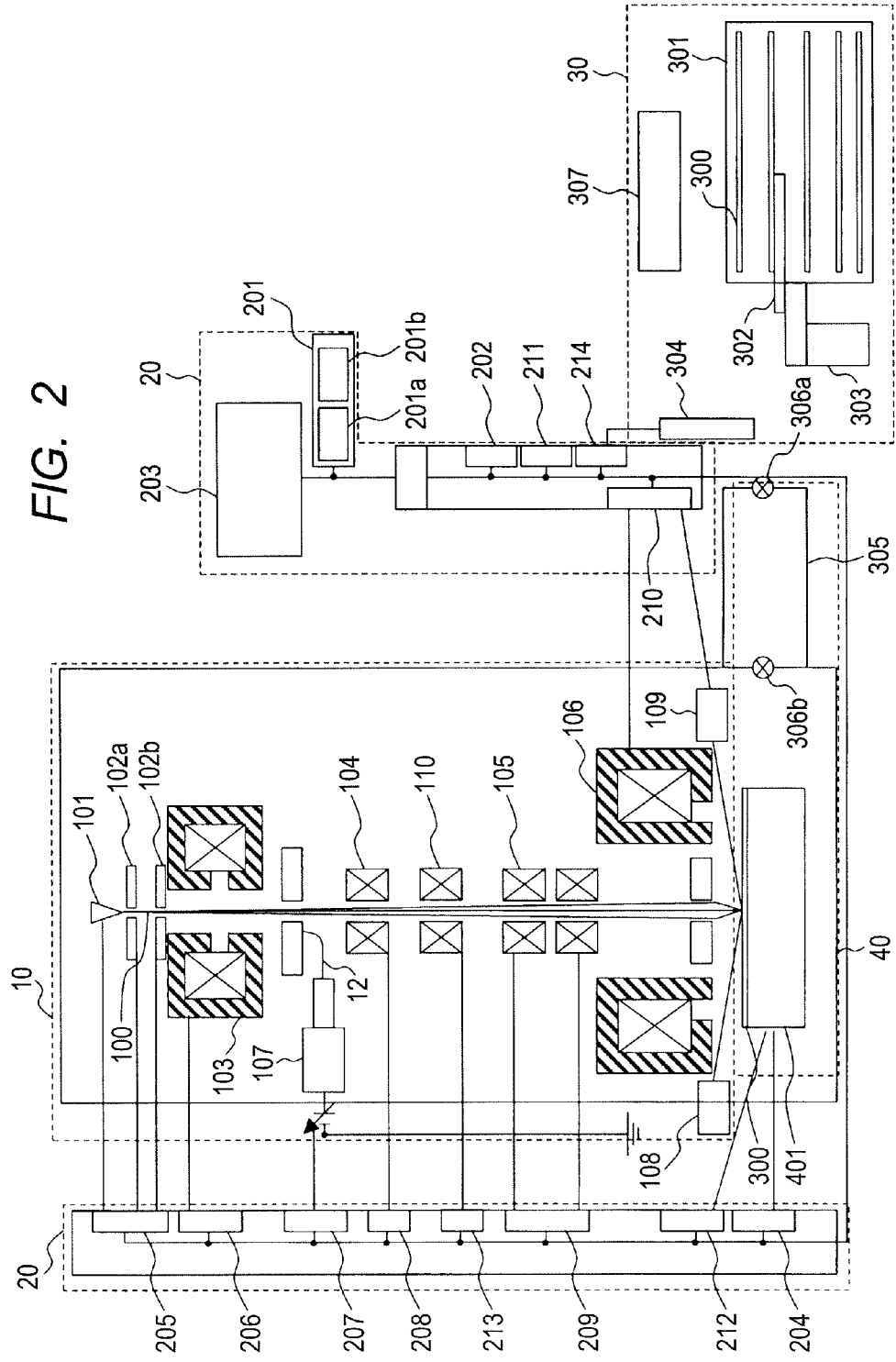
[FIG. 2] is a view which schematically shows the configuration of a scanning electron microscope system according to a first embodiment.

FIG. 2 is a view which schematically shows the configuration of a charged particle beam device, namely a scanning electron microscope system, according to the first embodiment.

As shown in the figure, the scanning electron microscope system in this embodiment includes a charged particle beam optical system 10, control system 20, transport system 30, and sample chamber 40. The charged particle beam optical system 10 includes a charged particle source 101 which emits a primary charged particle beam 100, extracting electrode 102, condenser lens 103, alignment coil 104, deflection coil 105, objective lens 106, secondary charged particle detector 107, laser light emitter for height detection 108, position sensor 109, and stigmator 110.

The control system 20 includes a central control section 201, user interface section 202, charged particle beam optical system controller 203, stage controller 204, accelerating voltage controller 205, condenser lens control section 206, amplifier 207, alignment control section 208, deflection signal control section 209, objective lens control section 210, secondary charged particle image display unit 211, retarding control section 212, and stigmator control section 213. The central control section 201 is included of a central processing unit (CPU) 201a as a processing section and a memory 201b as a storage section. Similarly the charged particle beam optical system controller 203 also includes a processing section and a memory (not shown), in which the processing section performs various control, image processing and arithmetic operations as explained below and the memory stores various types of measurement data and calculation result data.

By controlling the accelerating voltage controller 205 from the charged particle beam optical system controller 203, a charged particle beam 100 is accelerated to a suitable level for sample observation, analysis, etc. Setup parameters to control the current and focusing divergence angle of the charged particle beam 100 is given from the charged particle beam optical system controller 203 to the condenser lens control section 206. At that time, the charged particle beam optical system controller 203 sends a value for correcting an alignment error of the charged particle beam 100 to the alignment control section 208. The charged particle beam optical system controller 203 sends a value for focusing the charged particle beam 100 on the sample to the objective lens control section 210. The deflection signal control section 209 lets the deflector 105 deflect the charged particle beam 100 and synchronizes it with a signal from the amplifier 207 to create an observation image on the secondary charged particle image display unit 211. Comparison of an observation image is made by image processing or operator observation upon each change of a setup parameter for the objective lens control section 210 or retarding control section 212 to make a judgment about a focal point.

The transport system 30 includes a wafer cassette 301 for holding a semiconductor wafer 300 as a sample, carrying arm 302, wafer transport device 303, aligner 307, probe 304, sample exchange chamber 305, and gate valves 306a and 306b.

The sample chamber 40 has a sample stage 401 which moves the semiconductor wafer 300 in a direction perpendicular to the incident direction of the charged particle beam 100.

The central control section 201 controls the whole system through the charged particle beam optical system controller 203, stage controller 204 and wafer transport device 303 according to inspection recipe information (accelerating voltage of the charged particle beam 100, data on the semiconductor wafer 300, measuring point position data, etc) entered by an operator through the user interface section 202.

As the wafer transport device 303 receives a command from the central control section 201, it manipulates the carrying arm 302 to pick up a semiconductor wafer 300 from the wafer cassette 301. Then, it opens the gate valve 306a, which separates the sample exchange chamber 305 in which a vacuum is held, from the outside under the atmospheric pressure, and carries the semiconductor wafer 300 into the sample exchange chamber 305. The semiconductor wafer 300, having entered the sample exchange chamber 305, is then carried into the sample chamber 110 through the gate valve 306b and fixed on the sample stage 401. According to a command from the central control section 201, the charged particle beam optical system controller 203 controls the accelerating voltage controller 205, condenser lens control section 206, amplifier 207, alignment control section 208, deflection signal control section 209, objective lens control section 210, and retarding control section 212.

The charged particle beam 100 extracted from the charged particle source 101 by the extracting electrode 102 is focused by the condenser lens 103 and objective lens 106 and cast on the semiconductor wafer 300 on the sample stage 401. As for the primary charged particle beam 11 extracted from the charged particle source 101, its trajectory is adjusted by the alignment coil 104 and it is used for two-dimensional scanning on the semiconductor wafer 300 through the deflection coil 105 which has received a signal from the deflection signal control section 209.

A retarding voltage (negative voltage in the case of an electron microscope) for decelerating the primary charged particle beam 100 is applied from the retarding control section 212 to the semiconductor wafer 300 on the sample stage 401. Due to irradiation of the semiconductor wafer 300 with the primary charged particle beam 100, secondary charged particles are emitted from the semiconductor wafer 300. These secondary charged particles are detected by the secondary charged particle detector 107 and used as a brightness signal for the secondary charged particle image display unit 211. A scan signal from the secondary charged particle image display unit 211 is synchronized with a deflection signal from the deflection coil 105. Therefore, the shape of the circuit pattern formed on the semiconductor wafer 300 is faithfully reproduced on the secondary charged particle image display unit 211. Here, secondary charged particles refer to charged particles emitted from the semiconductor wafer 300 secondarily along with irradiation with the charged particle beam 100 and generally what is called secondary electrons, Auger electrons, reflected electrons or secondary ions.

In the above scanning electron microscope system, in order to measure the circuit pattern on the semiconductor wafer 300 at high speed, so-called focusing adjustment, a process to detect the height of the semiconductor wafer 300 when the sample stage 401 moves to a desired measuring point and adjust the focal length of the objective lens 106 according to the height, is needed. For this purpose, a wafer height detection mechanism which uses laser light is provided. The sample stage position detector detects the position of the sample stage and when the sample stage 401 comes near the desired position, the height detection laser light emitter 108 irradiates the semiconductor wafer 300 on the sample stage 401 with laser light. Then, the reflected light is received by the position sensor 109 and the height of the semiconductor wafer 300 is detected from the position where the light has been received. This height data of the semiconductor wafer 13 is fed back to the focal length of the objective lens 106. In other words, the objective lens control section 210 adjusts the focal length of the objective lens 106 based on the height data of the semiconductor wafer 13 as detected by the position sensor 109. Consequently, when the sample stage 401 reaches a prescribed position, the charged particle beam 100 is focused on the semiconductor wafer 300. Therefore, the circuit pattern of the semiconductor wafer 300 is automatically detected without operation by an operator.

In this embodiment, the objective lens 106 is an electromagnetic lens and its focal length is determined by excitation current. The excitation current required to focus the charged particle beam 100 on the semiconductor wafer 300 is expressed by a function of the accelerating voltage of the charged particle beam 100, the surface electrostatic potential of the semiconductor wafer 300, and the height of the semiconductor wafer 300. This function can be derived by optical simulation or actual measurement.

If there is no astigmatism or electrostatic charge, the surface electrostatic potential of the semiconductor wafer 300 is equal to the retarding voltage regardless of the measuring point position. In this case, the excitation current required to focus the charged particle beam 100 on the semiconductor wafer 300 is expressed by a function of the accelerating voltage of the primary charged particle beam 11 and the height of the semiconductor wafer 300. Therefore, if the accelerating voltage of the primary charged particle beam 100 is constant, by feeding back the height data of the semiconductor wafer 300 at the measuring point as detected by the position sensor 109 to the focal length of the objective lens 106, the primary charged particle beam 100 can be focused at this measuring point.

However, if there is astigmatism or electrostatic charge, the amount of astigmatism correction and the surface electrostatic potential of the semiconductor wafer 300 vary depending on the measuring point position. In this case, the amount of astigmatism correction and excitation current required to focus the charged particle beam 100 on the semiconductor wafer 300 cannot be found only by a function of the accelerating voltage of the charged particle beam 100, the surface electrostatic potential of the semiconductor wafer 300, and the height of the semiconductor wafer 300. Therefore, even if the accelerating voltage of the charged particle beam 100 is constant, the charged particle beam 100 cannot be focused at this measuring point without not only feeding back the height data of the semiconductor wafer 300 at the measuring point as detected by the position sensor 109 but also feeding back the amount of astigmatism correction at this measuring point to the stigmator 110 and the surface electrostatic potential to the focal length of the objective lens 106. The height data of the measuring point can be obtained by real-time measurement using the height detection laser light emitter 108 and position sensor 109 just before starting measurement. However, it is not realistic to measure the amount of astigmatism correction at the measuring point and the surface electrostatic potential just before starting measurement.

Figure 3:
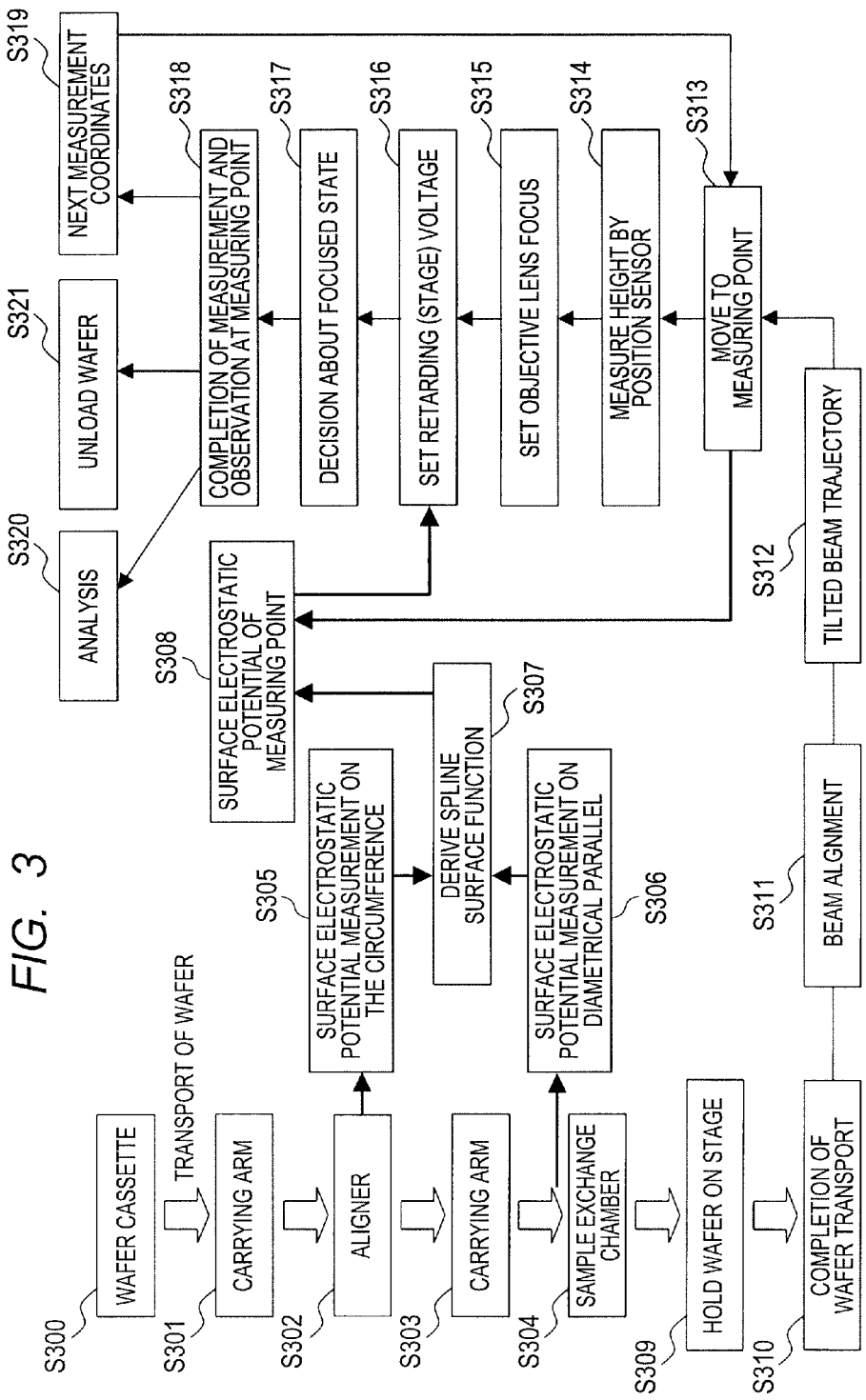
[FIG. 3] is a view which shows a flowchart for the scanning electron microscope system according to the first embodiment.

Thus, the scanning electron microscope system according to this embodiment operates as indicated in the flowchart of FIG. 3.

First, in the scanning charged particle microscope system, the semiconductor wafer 300 is loaded in the sample exchange chamber 305 (S304) and carried into the sample chamber 40 through the gate valve 306b. The semiconductor wafer 300 is held on the sample stage 401 (S309) and aligned with the sample stage position detector (not shown). The sample stage position detector detects the sample stage position and the sample stage is moved to the vicinity of a desired position (S310). The deflection signal control section 209 uses the deflector 105 to deflect the charged particle beam 100 and creates an observation image on the secondary charged particle image display unit 211 by synchronization with a signal from the amplifier 207.

Upon each change of a setup parameter in the alignment control section 208, the amount of movement of the observation image due to change in the objective lens control section 210 or retarding control section 212 is compared by image processing or operator observation to find the parameter for the minimum and make a decision about alignment. Upon each change of a setup parameter in the objective lens control section 210 or retarding control section 212, the observation image is compared by image processing or operator observation to make a decision about a focal point. Similarly, upon each change of a setup parameter in the stigmator control section 213, the observation image is compared by image processing or operator observation to make a decision about the convergence point for astigmatic difference. An alternative method for decision about the convergence point for astigmatic difference is that comparison is made of the observation image upon each change of a setup parameter in the objective lens control section 210 or retarding control section 212 by image processing. The beam alignment process of the primary charged particle beam 100 is completed when the above decisions about alignment, focal point and astigmatic difference convergence point have been made (S311).

Next, by making appropriate settings in the deflection signal control section 209 and alignment control section 208, the primary charged particle beam 100 is brought into a tilted beam trajectory to irradiate the semiconductor wafer 300 obliquely at a prescribed tilt angle and a prescribed azimuth angle. The control can also be made easier by adding another set of deflection coil 105 and deflection signal control section 209 or alignment coil 104 and alignment control section 208 for the tilted beam trajectory. Upon each change of a setup parameter in the deflection signal control section 209, the amount of movement of the observation image before and after setting in the tilted beam trajectory is compared by image processing or operator observation to find the minimum and make a decision about the tilted beam trajectory. The charged particle beam optical system controller 203 registers the setup parameters for the deflection signal control section 209 and alignment control section 208, the abovementioned tilt angle and azimuth angle and the abovementioned amount of movement of the observation image in the memory area of the memory provided in the charged particle beam optical system controller 203 as a tilted beam trajectory (S312). Regarding the registered tilted beam trajectory, the beam irradiation angle is tilted in the range from 0.1 to 10 degrees with respect to the semiconductor wafer 300. Plural tilted beam trajectories are registered in which the azimuth angle for tilting is changed as necessary.

The beam alignment and registration of tilted beam trajectories as mentioned above are made by selecting items as needed each time a semiconductor wafer 300 is loaded in the sample chamber 40. For example, when semiconductor wafers 300 in a lot are exchanged, the beam alignment and tilted beam trajectory registration may be omissible.

Next, the position of the sample stage is detected by the sample stage position detector (not shown) and the sample stage is moved to the vicinity of the measuring point (S313). The height of the semiconductor wafer 300 is detected by the position sensor 109 (S314) and the focal point position of the objective lens 106 is adjusted to the height (S315). When necessary, the retarding control section 212 controls the landing energy of the primary charged particle beam 100 in conjunction with the surface electrostatic potential at the measuring point (S316).

When handling an electrostatically charged wafer, in order to prevent a focusing error, the surface electrostatic potential must be corrected by the retarding voltage applied to the wafer. For example, the flow of correcting the surface electrostatic potential as disclosed in WO 2003/007330 is given below.

1) When loading a wafer in the device, its surface electrostatic potential is measured (S305, 5306) concurrently with wafer transport (S300-S304). In the present circumstances, measurements are made on a straight line passing through the center of the wafer at regular intervals (S306).

2) A function which approximates a one-dimensional distribution of surface electrostatic potential is calculated by fitting an even function to the measurement result of surface electrostatic potential using the least-square method (S307). Further, assuming rotational symmetry of surface electrostatic potential distribution, it is developed into a function representing a two-dimensional distribution.

3) After loading of the sample, the stage is moved to an alignment pattern provided near the measuring point.

4) The wafer potential is predicted based on the approximate function obtained in 2) (S308) and the retarding voltage is calculated.

5) The optimum retarding voltage is found by checking the focus while changing the retarding voltage above and below the voltage obtained in 4) (S316).

6) The stage is moved to the measuring point and measurement is made.

Among these steps, 1) and 2) are carried out only once for each wafer concurrently with transporting, so their influence on the processing time per wafer is small. However, steps 3) to 6) are repeated for each measuring point, so their influence on the processing time per wafer is large.

At step 5), the optimum retarding voltage is searched by checking the focus while changing the retarding voltage within a predetermined range at regular voltage integrals. The time required to determine the optimum value depends on the voltage range, voltage interval and signal import time. In the case of a wafer whose electrostatic charge distribution is not rotationally symmetric, this process can be performed by improving steps 1) and 2).

The processing section of the charged particle beam optical system controller 203 loads the registered value of tilted beam trajectory (S312) on the deflection signal control section 209 and alignment control section 208 and measures the amount of movement of the observation image before and after setting in the tilted beam trajectory by image processing. The amount of movement of the observation image is measured while the tilting azimuth angle for the tilted beam trajectory is changed as necessary. In this embodiment, the amounts of movement of the observation image between azimuth angles 0 and 90 degrees and between 45 and 135 degrees are measured is measured and the astigmatic difference (range finding between astigmatic focal lengths) and focal point position are calculated from the amount of observation image movement/tilt angle. The processing section of the charged particle beam optical system controller 203 sets the amount of astigmatism correction as calculated by multiplying the astigmatic difference by the astigmatic coil sensitivity, on the stigmator control section 213. In order to obtain the focal point, the amount of objective lens correction as calculated by multiplying the focal point position by the objective lens sensitivity is set on the objective lens control section 210 or the amount of retarding correction as calculated by multiplying the focal point position by the retarding sensitivity is set on the retarding control section 212.

The processing section of the charged particle beam optical system controller 203 performs measurement of astigmatic difference and setting it onto the stigmator control section 213, and measurement of the focal point position and setting it onto the objective lens control section 210 by selecting items as necessary for each measuring point. For example, if no astigmatic difference arises between measuring points, setting onto the stigmator control section 213 may be omissible.

In the decision about a focused state (S317) in the above flow performed by the processing section of the charged particle beam optical system controller 203, the primary charged particle beam 100 is focused at the measuring point and the deflection signal control section 209 deflects the charged particle beam 100 by the deflector 105 and synchronizes it with a signal from the amplifier 207 to create an observation image on the secondary charged particle image display unit 211. After completion of measurement and observation at the measuring point (S318), the sample stage is moved to next measurement coordinates (S319) and the above flow is repeated. The results of measurement and observation at the measuring point are sent to the analysis step (S320) to make a high level of analysis. After measurement and observation are completed at all measuring points, the wafer is unloaded (S321) and exchanged.

Figure 4:
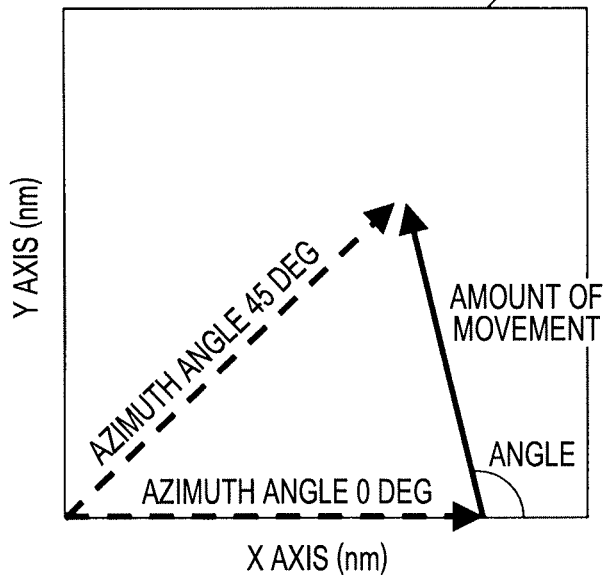
[FIG. 4] is a view which illustrates the amount of image movement caused by parallax with electron beams tilted at azimuth angles 0 and 45 degrees.

First, a case that only an astigmatic difference is corrected is described. Given below is how the processing section of the charged particle beam optical system controller 203 calculates two astigmatic differences between azimuth angles 0 and 90 degrees and between 45 and 135 degrees with respect to the sample from the amount of visual field shift obtained by comparison between two images. FIG. 4 is a view of the X-Y plane 41 which shows the amount of image movement caused by parallax when an observation image is obtained with a charged particle beam tilted 0.1 to 10 degrees at azimuth angles 0 and 45 degrees. The processing section calculates the amount of visual field shift caused by parallax at two azimuth angles 0 and 45 degrees with respect to the sample from the visual field shift distance and visual field shift direction. The amount of visual field shift with parallax at an azimuth angle of 45 degrees is expressed as follows:

[Equation 1]

$$L_{45} = \sqrt{2} L \cdot \mathrm{Sin}(\theta) \tag{1}$$

Here, $L_{45}$ denotes the amount of visual field shift at an azimuth angle of 45 degrees, L denotes the amount of visual field shift, and $\theta$ denotes the angle of visual field shift. Specifically, the amount of visual field shift at an azimuth angle of 45 degrees is calculated by multiplying the amount of visual field shift by a sine function of angle and multiplying the result by root 2. Next, the amount of visual field shift with parallax at an azimuth angle of 0 degree is expressed as follows:

[Equation 2]

$$L_0 = L \cdot \mathrm{Sin}(\theta) + L \cdot \mathrm{Cos}(\theta) \tag{2}$$

Here, $L_0$ denotes the amount of visual field shift at an azimuth angle of 0 degree. The amount of visual field shift at an azimuth angle of 0 degree is calculated by the amount of visual field shift multiplied by a sine function of angle plus that multiplied by a cosine function of angle. The astigmatic difference between azimuth angles 45 degrees and 135 degrees is expressed as follows:

[Equation 3]

$$D_{45\text{-}135} = 2L_{45}/\mathrm{Tan}(\alpha) \tag{3}$$

The astigmatic difference between azimuth angles 0 degree and 90 degrees is expressed as follows:

[Equation 4]

$$D_{0\text{-}90} = 2L_0/\mathrm{Tan}(\alpha) \tag{4}$$

Here, $D_{45\text{-}135}$ denotes the astigmatic difference between azimuth angles 45 degrees and 135 degrees, $\alpha$ denotes a tilt angle by which a charged particle beam is tilted, and $D_{0\text{-}90}$ denotes the astigmatic difference between azimuth angles 0 degree and 90 degrees. The distance calculated by dividing the amount of visual field shift at the azimuth angles of 45 degrees and 0 degree by a tangent function of tilt angle corresponds to the astigmatic difference in each azimuth direction. The above tilt angle is an angle by which the beam is tilted at azimuth angles 0 degree and 45 degrees but such distance may not always correspond to such astigmatic difference. In that case, correction through a trigonometric function, etc is required. Lastly, the amount of astigmatism correction as calculated by multiplying the above astigmatic difference calculated from the amount of visual field shift by astigmatic coil sensitivity is set on the stigmator control section 213. Generally, the astigmatic coil sensitivity is often processed by a determinant of matrix, etc because it involves rotary or nonlinear action. The accuracy is improved by taking into consideration the tilted beam trajectory, the tilt angle and azimuth angle for registration and deviation of observation image movement from the ideal trajectory.

In the constitution according to this embodiment, the amount of astigmatism can be calculated from two observation images and under an observation condition of 10 pA beam current, astigmatism correction was completed in 100 msec to 600 msec.

Figure 5:
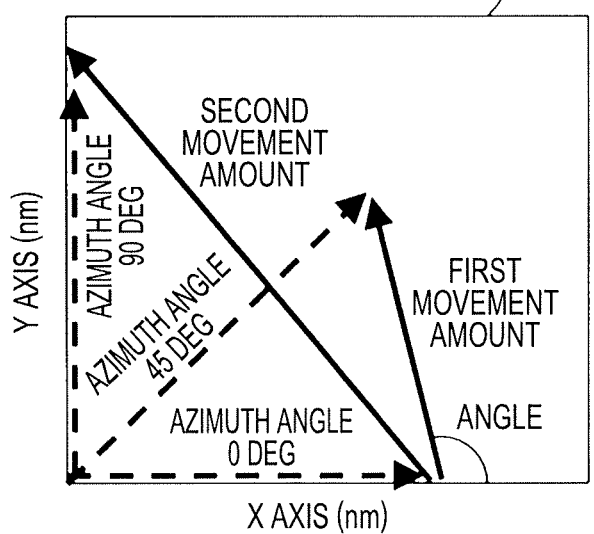
[FIG. 5] is a view which illustrates the amount of image movement caused by parallax with tilting at azimuth angles 0, 45 and 90 degrees.

Next, how detections of astigmatic difference and of focal point are performed concurrently will be described. FIG. 5 is a view of the X-Y plane 51 which shows the amount of movement caused by parallax when an observation image is obtained with a charged particle beam tilted 0.1 to 10 degrees at azimuth angles 0, 45 and 90 degrees. In the same way as shown in FIG. 4, the amount of movement caused by parallax at an azimuth angle of 45 degrees with respect to the sample, based on the distance and angle of the first movement, and the amounts of movement caused by parallax at azimuth angles of 0 and 90 degrees with respect to the sample, based on the distance and angle of the second movement, are expressed as follows:

[Equation 5]

$$L_{45} = \sqrt{2} L_1 \cdot \mathrm{Sin}(\theta_1)$$

$$L_0 = L_2 \cdot \mathrm{Sin}(\theta_2)$$

$$L_{90} = L_2 \cdot \mathrm{Cos}(\theta_2) \quad (5)$$

Here, $L_{45}$ denotes the amount of movement caused by parallax at an azimuth angle of 45 degrees, $L_1$ denotes the amount of movement caused by parallax between azimuth angles 0 and 45 degrees, $\theta_1$ denotes the angle of movement caused by parallax between azimuth angles 0 and 45 degrees, $L_0$ denotes the amount of movement caused by parallax at an azimuth angle of 0 degree, $L2$ denotes the amount of movement caused by parallax between azimuth angles 0 and 90 degrees, $\theta_2$ denotes the angle of movement caused by parallax between azimuth angles 0 and 90 degrees, and $L_{90}$ denotes the amount of movement caused by parallax at an azimuth angle of 90 degrees. The focal point position and the astigmatic difference (range finding between astigmatic focal lengths) between azimuth angles 0 and 90 degrees are expressed as follows:

[Equation 6]

$$F = (L_0 + L_{90})/2 \, \mathrm{Tan}(\alpha)$$

$$D_{0\text{-}90} = (L_0 - L_{90})/\mathrm{Tan}(\alpha) \quad (6)$$

Here, F denotes focal point position, α denotes a tilt angle by which a charged particle beam is tilted, and $D_{0\text{-}90}$ denotes the astigmatic difference between azimuth angles 0 degree and 90 degrees.

The average of distances and the difference between them which are calculated by dividing the amounts of movement at azimuth angles 0 degree and 90 degrees by a tangent function of tilt angle correspond to the focal point position and the astigmatic difference between azimuth angles 0 and 90 degrees respectively. Furthermore, the astigmatic difference between azimuth angles 45 and 135 degrees is expressed as follows:

[Equation 7]

$$D_{45\text{-}135} = 2(L_{45}/\mathrm{Tan}(\alpha) - F) \quad (7)$$

Here, $D_{45\text{-}135}$ denotes the astigmatic difference between azimuth angles 45 and 135 degrees.

The distance calculated by dividing the distance as the amount of movement at an azimuth angle of 45 degrees minus the distance calculated by multiplying the focal point position by a tangent function of tilt angle, by a tangent function of tilt angle is the astigmatic difference between azimuth angles 45 and 135 degrees. Lastly, the amount of astigmatism correction as calculated by multiplying the above astigmatic difference calculated from the amount of visual field shift by astigmatic coil sensitivity is set on the stigmator control section 213 and at the same time, the amount of objective lens correction as calculated by multiplying the focal point position by objective lens sensitivity is set on the objective lens control section 210 or the amount of retarding correction as calculated by multiplying the focal point position by retarding sensitivity is set on the retarding control section 212 to obtain the focal point. As detailed above, in this embodiment, the astigmatic difference and focal point position can be calculated from three observation images and under an observation condition of 10 pA beam current, focus and astigmatism correction were completed in 150 msec to 900 msec. $D_{0\text{-}90}$ can also be calculated from the amount of movement between azimuth angles 0 and 270 degrees. $D_{45\text{-}135}$ can also be calculated from the amount of movement between azimuth angles 135 and 225 degrees, between 225 and 315 degrees, or between 315 and 45 degrees.

The focal point position can be measured more accurately by tilting the beam at azimuth angles 0 and 180 degrees with respect to the sample and measuring the amount of movement caused by parallax. Also, the focal point position at which the amount of movement is 0 can be detected more accurately by changing the focal point position by the objective lens or retarding, measuring the amounts of movement caused by parallax at plural points and fitting them by a function. The astigmatic difference between azimuth angles 0 and 90 degrees can be measured more accurately by measuring the difference between the amount of movement caused by parallax between azimuth angles 90 and 270 degrees with respect to the sample and that between azimuth angles 0 and 180 degrees. The above method can be applied to measurement of the astigmatic difference between azimuth angles 45 and 135 degrees. At each azimuth angle, the focal point position is changed by the objective lens or retarding and the amount of movement caused by parallax is measured at plural points. The focal point position at which the amount of movement is 0 is detected from the amount of movement caused by parallax by fitting by a function. The processing section of the charged particle beam optical system controller 203 can calculate the astigmatic difference accurately from the difference in focal point position between azimuth angles as calculated by the above method.

Second Embodiment

Figure 6:
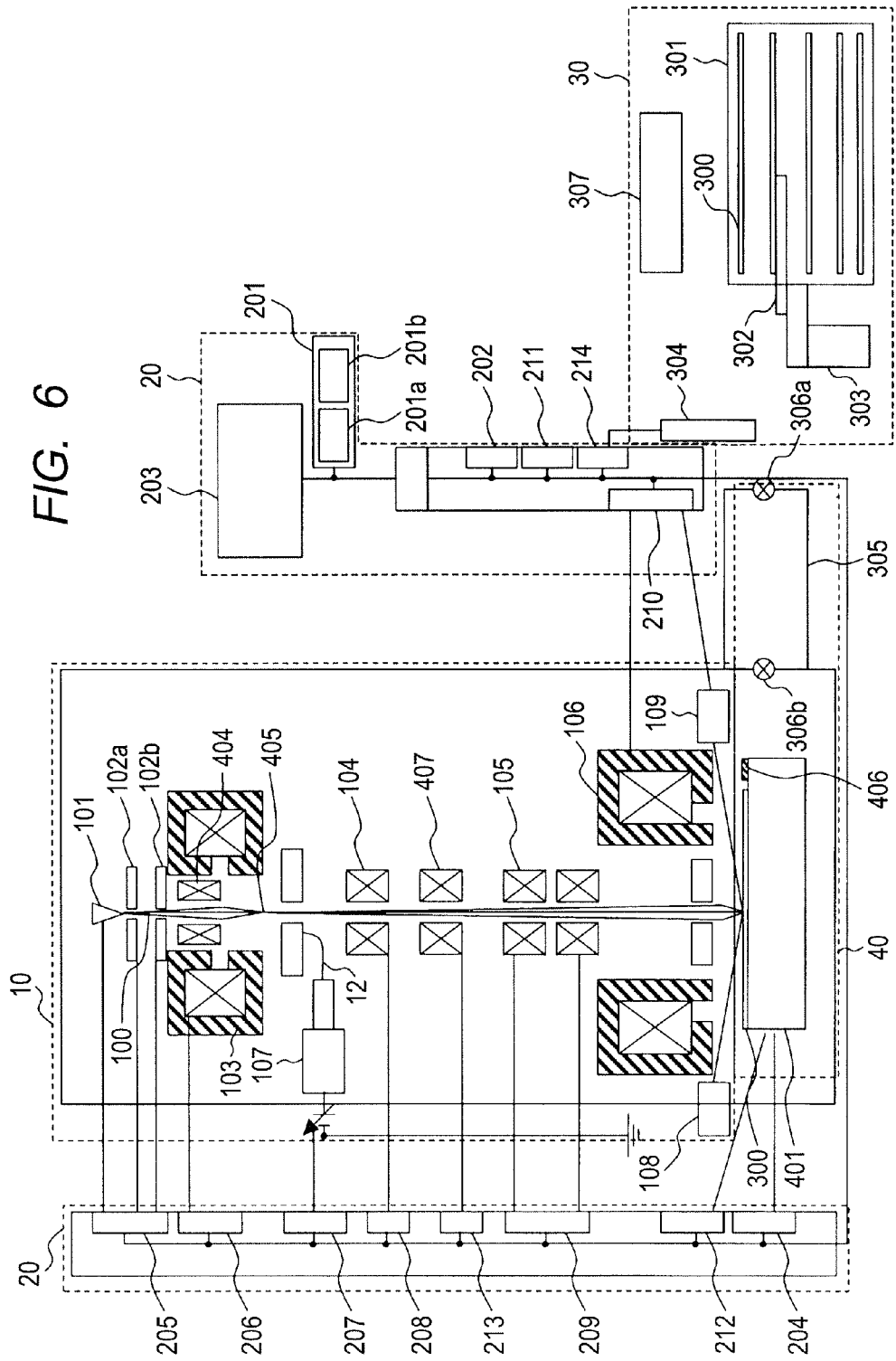
[FIG. 6] is a view which schematically shows the configuration of a scanning electron microscope system according to a second embodiment.
Figure 7:
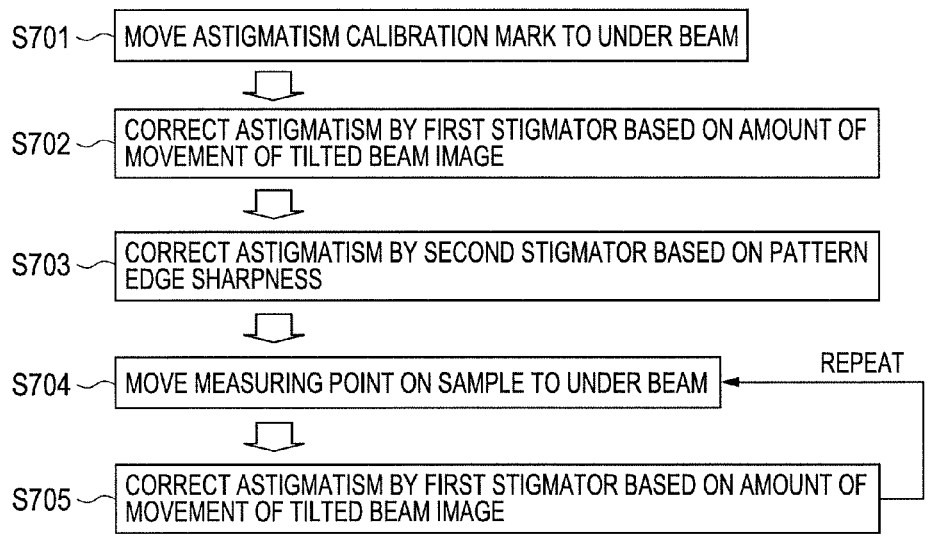
[FIG. 7] is a view which shows a flowchart for the scanning electron microscope system according to the second embodiment.

FIG. 6 is a schematic view of the configuration of a device according to the second embodiment and FIG. 7 shows the flowchart thereof. This embodiment focuses on astigmatism correction. A first stigmator 407 is located inside the objective lens and a second stigmator 404 is located outside the objective lens. Here, "inside the objective lens" means "located between an object plane 405 of the objective lens and a sample 300 to form an image plane while "outside the objective lens" means "located outside it". Also in this embodiment, an astigmatism calibration mark 406 is provided on the stage.

How the second embodiment works is summarized according to the flowchart of FIG. 7. The astigmatism calibration mark 406 is moved to under the beam (S701). The mark 406 is made of tungsten on a silicon substrate so that it is conductive. Preferably the mark shape has edges in plural directions and has a high density. The astigmatism calibration mark 406 may be placed in a sample holder. Then, astigmatism correction is made by the first stigmator 407 based on the amount of movement of the tilted beam image (S702). In this embodiment, since a tilted beam trajectory is formed inside the objective lens using the alignment coil 104 and deflection coil 105, astigmatism which results from the tilted beam image is astigmatism inside the objective lens. The reasons for the formation of the tilted beam image inside the objective lens are that existing electro-optical elements such as the alignment coil and deflection coil can be used and that if a tilted beam should be formed above the objective lens, the beam would collide with an electro-optical element located midway.

Furthermore, astigmatism correction is made by the second stigmator 404 based on pattern edge sharpness (S703). Since astigmatism based on pattern edge sharpness is the sum of astigmatisms which occur in the entire electron beam system, the second stigmator substantially corrects astigmatism outside the objective lens. The values given to the respective stigmators are shown on the secondary charged beam image display unit 211.

After the above preparatory steps, the measuring point of the sample is moved to under the beam (S704). Astigmatism which newly occurs with the sample is attributable to an electrostatic charge distribution in the sample and astigmatism occurs inside the objective lens. Therefore, the advantage of astigmatism measurement using a tilted beam, which is expected to ensure high speed and high accuracy, is fully exhibited. Astigmatism correction is made using the first stigmator based on the measured amount of astigmatism correction (S705). When the first stigmator is installed inside the objective lens, the amount of movement of the tilted beam image is smaller than the amount of correction and thus it is possible to verify the effect of correction and enhance the correction accuracy by repetition.

Here, if there are plural measuring points, movement of the measuring point position and astigmatism correction are repeated. The initial use of the astigmatism calibration mark 406 depends on the stability of the device and the mark may be used for each lot or on a daily basis. Astigmatism inside the objective lens can also be calculated from the pattern edge sharpness in the image. Therefore, it is possible to calculate astigmatism by two methods and compare the calculation results for verification and this changeover is done on the secondary charged beam image display unit 211.

By using the first stigmator, the effect of correction using the tilted beam can be verified. Since most of the astigmatisms specific to the device occur outside the objective lens, it can be thought that in this embodiment, practically sample-induced astigmatism is corrected by the first stigmator 407 and device-induced astigmatism is corrected by the second stigmator 404.

Figure 8:
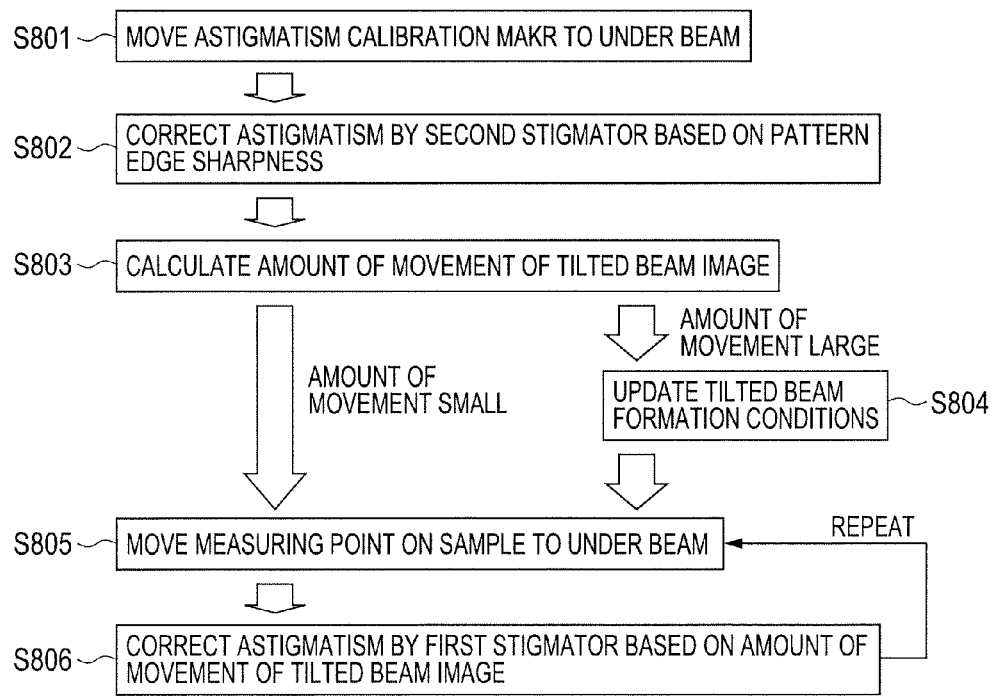
[FIG. 8] is a view which shows another flowchart for the scanning electron microscope system according to the second embodiment.

Also, astigmatism can be corrected according to the flowchart of FIG. 8. First, the astigmatism calibration mark 406 is moved to under the beam (S801). Next, astigmatism correction is made by the second stigmator 404 based on pattern edge sharpness (S802). Next, a tilted beam trajectory is formed and the amount of movement of the image is measured (S803). If the amount of image movement is large, the conditions for the formation of the tilted beam trajectory are finely adjusted so that the amount of movement is zero (S804) and if the amount of image movement is small, the amount of movement is saved and the sequence goes to the next step. This is based on the idea that the nonexistence of general astigmatism is only needed even when there is astigmatism inside the objective lens.

After that, the measuring point of the sample is moved to under the beam (S805) and astigmatism is corrected using the first stigmator based on the amount of movement of the tilted beam image (S806). At this time, astigmatism which has newly occurred is calculated from the amount of movement of the tiled beam image on the sample with reference to the amount of movement of the image on the astigmatism calibration mark. As in the case of FIG. 4, if there are plural measuring points, movement of the measuring point position and astigmatism correction are repeated. The tilted beam condition settings depend on the stability of the device and such settings should be made for each lot or on a daily basis.

As a result, it is possible to correct astigmatism with the device and astigmatism on the sample individually and eventually correct astigmatism on the sample at an accuracy of 0.5 µm or less of astigmatic difference and in not more than 1 second.

Although this embodiment focuses on astigmatism correction, similar steps can be taken for focus correction. Specifically, instead of the first stigmator 407, focus correction means in the objective lens such as the objective lens 106 and voltage of the sample 300 should be used and instead of the second stigmator, focus correction means outside the objective lens such as the condenser lens 103 should be used and the amount of focus correction should be given. The use of a tilted beam makes it possible to measure astigmatism and defocus simultaneously and dealing with both aberration issues simultaneously offers a great advantage from the viewpoint of efficiency. What has been mentioned above is generally true for the present invention and not limited to this embodiment.

Third Embodiment

Figure 9:
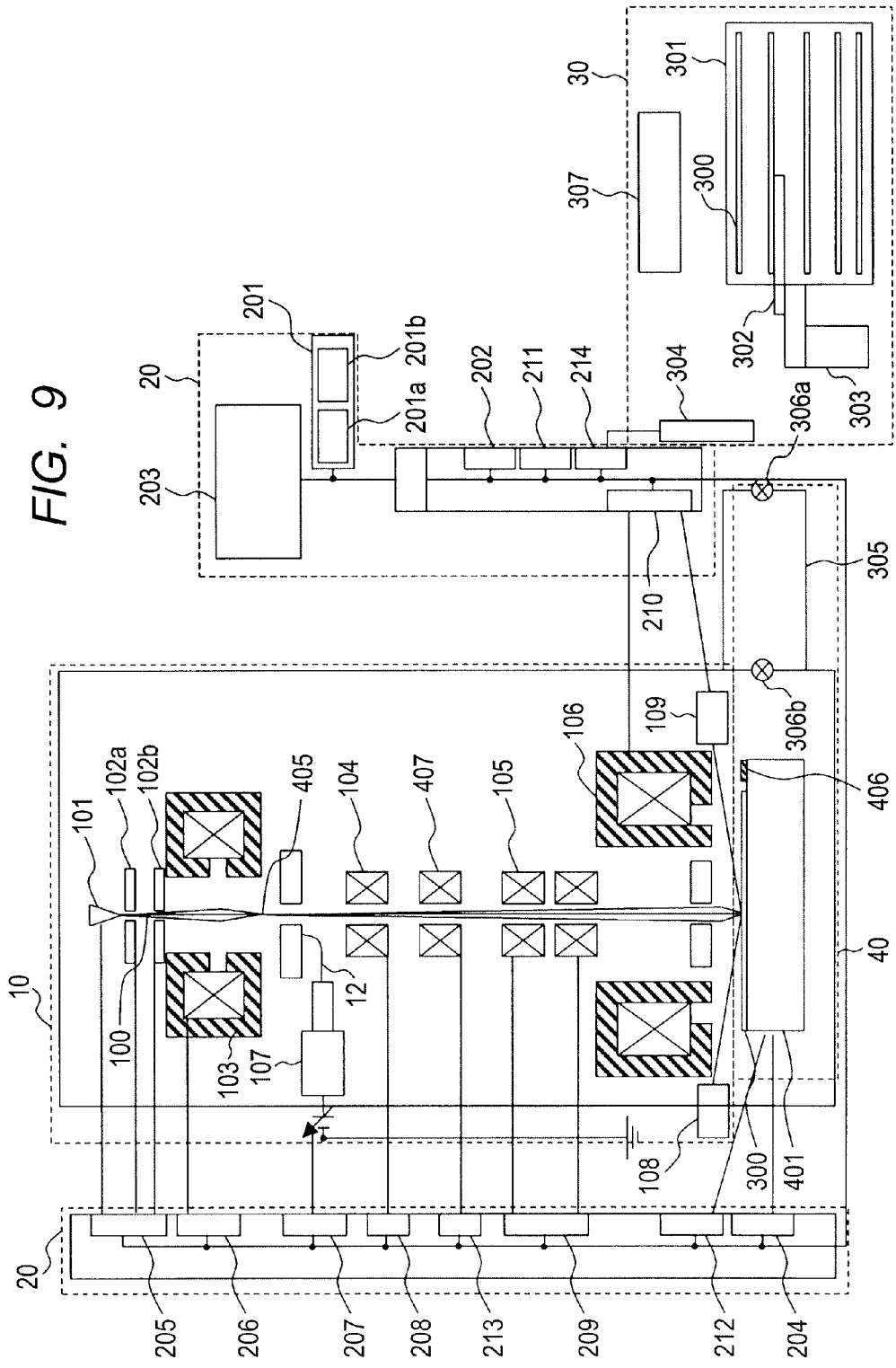
[FIG. 9] is a view which schematically shows the configuration of a scanning electron microscope system according to a third embodiment.
Figure 10:
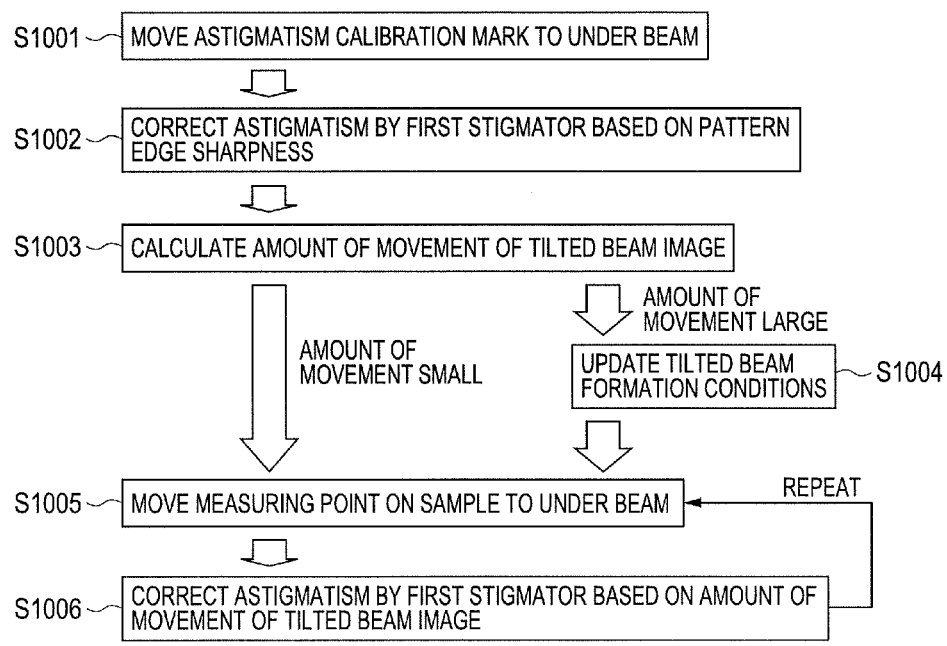
[FIG. 10] is a view which shows a flowchart for the scanning electron microscope system according to the third embodiment.

FIG. 9 is a schematic view of the configuration of a device according to the third embodiment and FIG. 10 shows the operation flowchart thereof. The first stigmator 407 inside the objective lens is mounted in the device shown in FIG. 9 but no second stimgator is mounted therein.

First, the astigmatism calibration mark 406 is moved to under the beam (S1001). Next, astigmatism correction is made by the first stigmator 407 based on pattern edge sharpness (S1002). Next, a tilted beam trajectory is formed and the amount of movement of the image is measured (S1003). If the amount of image movement is large, the conditions for the formation of the tilted beam trajectory are readjusted so that the amount of movement is zero (S1004) and if the amount of image movement is small, the amount of movement and the readjusted value are saved and the sequence goes to the next step. Since overall astigmatism is corrected by the stigmator inside the objective lens, it is likely that a large degree of astigmatism occurs inside the objective lens. However, astigmatism on the sample can be corrected by readjusting the conditions for the formation of a tilted beam trajectory and saving the amount of image movement. The reason that a stigmator still exists inside the objective lens is that it is used to verify the effect of correction and enhance the correction accuracy by repetition as in the second embodiment.

After that, the measuring point of the sample is moved to under the beam (S1005) and astigmatism is corrected using the first stigmator based on the amount of movement of the tilted beam image (S1006). At this time, astigmatism which has newly occurred is calculated from the amount of movement of the tiled beam image on the sample with reference to the amount of movement of the image on the astigmatism calibration mark 406. As in the case of FIG. 4, if there are plural measuring points, movement of the measuring point position and astigmatism correction are repeated. The tilted beam condition settings depend on the stability of the device and such settings should be made for each lot or on a daily basis.

In this embodiment, the amount of movement of the tilted beam image on the astigmatism calibration mark 406 is larger and more likely to cause a measurement value error than in the second embodiment but the number of stigmators is smaller. In this embodiment, it is possible to correct astigmatism on the sample at an accuracy of 1 µm or less of astigmatic difference and in not more than 1 second.

In the embodiments described above, beam alignment and registration of tilted beam trajectories are made by selecting items on the input screen as needed each time the semiconductor wafer 300 is loaded in the sample chamber 40.

FIG. 11 schematically shows an example of the configuration of an input screen shown on the user interface 202 of each embodiment. The Loaded Recipe window 1100 is a screen used to read a recipe for controlling the scanning charged particle beam microscope system from the memory or network and load and display it. The Cassette Setup window 1101 is a screen used to select a recipe for each wafer in the wafer cassette and display it. The Wafer Alignment window 1102 is a screen used to select an alignment recipe for each wafer and display it. Particularly this example features that the Beam Assign list and Beam Alignment icon for beam alignment recipe selection appear in the Cassette Setup window 1101 and Wafer Alignment window 1102. When a semiconductor wafer 300 in the wafer cassette or lot is exchanged, the above beam alignment and tilted beam trajectory registration steps may be omissible and details of the beam alignment flow can be specified.

The Beam Alignment screen 1103 is provided to set details of beam alignment. Particularly in this example, the Parallax Correction icon appears to allow selection of an action to correct the focal point position of the tilted beam trajectory and the parallax difference between azimuth directions. Along with the Parallax Correction icon, the Beam Alignment icon appears to allow alignment of the charged particle beam. The focal point position of the tilted beam trajectory can be detected by making a focused state by a conventional Auto Focus method and deflecting the beam so as to prevent visual field shift in the tilted beam trajectory. The parallax difference between azimuth directions can be detected by making a corrected state of astigmatic difference by a conventional Auto Astigmation method and deflecting the beam so as to prevent visual field shift in the tilted beam trajectory in each azimuth direction.

When the Measure Setup icon and Review Setup icon appear in the Loaded Recipe 1100, the auto sequence for the scanning charged particle microscope system according to each embodiment can be freely selected.

For the purpose of setting details of Measure Setup, the Measure Setup screen 1104 is user-friendly if it includes a Measure Address icon to select a measuring point in the wafer, a Measure Execution icon to set measurement details, and a Result Output icon to select the output method of measurement results.

For the purpose of setting details of Review Setup, the Review Setup screen 1105 is user-friendly if it includes a Loaded Defectlist icon to select a database concerning defective coordinates, a Detection Method icon to select a defect detection algorithm, a Detection Range icon to select a detection observation range, a Low Mag Image icon concerning setting and saving of an observation image for defect detection, a High Mag Image icon concerning setting and saving of a defect observation image, and a Classification icon concerning defect classification.

For the purpose of displaying the operational status in the auto sequence, the focal point position of the registered tilted beam trajectory and the parallax difference between azimuth directions can be displayed. For the purpose of periodic maintenance, the input screen may be provided with a button to start the automatic formation of a tilted beam trajectory. In this case, it is advisable to provide a screen which shows whether the automatic formation has succeeded or failed.

As explained so far, the present invention decreases the astigmatism control processing time to 1 second or less by improving the astigmatic difference measurement accuracy. Particularly, if a wafer has an astigmatism distribution, astigmatism correction can be made effectively. As a consequence, length measurement time can be drastically shortened. In addition, by using plural stigmators, device-induced astigmatism and sample-induced astigmatism can be measured and corrected individually, which is effective in the improvement of the correction accuracy.

Industrial Applicability

The present invention is useful as a charged particle beam device which uses a charged particle beam to measure the shape and size of a fine pattern on the surface of a sample (semiconductor wafer, reticle, etc).

DESCRIPTION OF REFERENCE NUMERALS

10 . . . Charged particle beam optical system
12 . . . Secondary charged particle beam
13 . . . Semiconductor wafer
20 . . . Control system
30 . . . Transport system
40 . . . Sample chamber
100 . . . Primary charged particle beam
101 . . . Charged particle source
102a, 102b . . . Extracting electrode
103 . . . Condenser lens
104 . . . Alignment coil
105 . . . Deflection coil
106 . . . Objective coil
107 . . . Secondary charged particle detector
108 . . . Height detection laser light emitter
109 . . . Position sensor
201 . . . Central control section
202 . . . User interface
203 . . . Charged particle beam optical system controller
204 . . . Stage controller
205 . . . Accelerating voltage controller
206 . . . Condenser lens control section
207 . . . Amplifier
208 . . . Alignment control section
209 . . . Deflection signal control section
210 . . . Objective lens control section
211 . . . Secondary charged particle image display unit
212 . . . Retarding control section
213 . . . Stigmator control section
214 . . . Surface potential meter
301 . . . Wafer cassette
302 . . . Carrying arm
303 . . . Wafer transport device
304 . . . Probe
305 . . . Sample exchange chamber
306a, 306b . . . Gate valve
307 . . . Aligner
404 . . . Second stigmator
405 . . . Objective lens object plane
406 . . . Astigmatism calibration mark
407 . . . First stigmator

The invention claimed is:

1. A scanning charged particle beam device using a charged particle beam, comprising:
   an electro-optical system, including an objective lens, that irradiates a sample with the charged particle beam of the scanning charged particle beam device;
   a memory that registers and holds electro-optical system setup parameters for irradiation with a beam tilted from a normal line on the sample;
   a sensor that detects a height data of the sample; and
   a processing section that controls a focal length of the objective lens based on the height data of the sample as detected by the sensor, measures an amount and angle of visual field shift due to parallax between images obtained using tilted beams at different azimuth angles and calculates an amount of astigmatism correction from the amount and angle of visual field shift.

2. The scanning charged particle beam device according to claim 1, wherein:
   the processing section compares observation images obtained by irradiation with a perpendicular beam from a normal direction on the sample and with a beam tilted from the normal line as the charged particle beams and measures the amount of movement.

3. The scanning charged particle beam device according to claim 1, wherein:
   the processing section compares observation images obtained by tilted beams in two trajectories with an azimuth angle of 45 degrees or 135 degrees with respect to a normal line on the sample and measures the amount of movement.

4. The scanning charged particle beam device according to claim 1, wherein:
   the processing section calculates the amount of movement from tilted beams in two reference trajectories with an azimuth angle of 45 degrees or 135 degrees with respect to a normal line on the sample and two trajectories with the azimuth angle of 90 degrees or −90 degrees with respect to the reference trajectories.

5. The scanning charged particle beam device according to claim 1, wherein:
   under at least two focus conditions of the electro-optical system, the processing section calculates an amount of astigmatism correction from the amounts of movement of observation images obtained by tilted beams in two trajectories with an azimuth angle of 45 degrees or 135 degrees with respect to a normal line on the sample.

6. The scanning charged particle beam device according to claim 1, wherein:
   under at least two focus conditions of the electro-optical system, the processing section calculates an amount of astigmatism correction from the amounts of movement of observation images obtained by tilted beams in two reference trajectories with an azimuth angle of 45 degrees or 135 degrees with respect to a normal line on the sample and two trajectories with the azimuth angle of 90 degrees or −90 degrees with respect to the reference trajectories.

7. The scanning charged particle beam device according to claim 3, wherein:
   the processing section calculates an amount of focus correction as well as the amount of astigmatism correction.

8. A scanning charged particle beam device using a charged particle beam, comprising:
   a stage on which a sample is loaded;
   a transport mechanism that carries the sample onto the stage;
   a charged particle beam optical system that irradiates the sample on the stage with the charged particle beam of the scanning charged particle beam device and detects secondary charged particles generated from the sample;
   a controller that determines setup parameters for the charged particle beam optical system and controls the charged particle beam optical system;
   at least one stigmator inside an objective lens in the charged particle beam optical system and at least one stigmator outside the objective lens; and
   a processing section which compares observation images obtained by the tilted beam, measures an amount and angle of visual field shift due to parallax between images obtained using tilted beams at different azimuth angles and calculates an amount of astigmatism correction from the amount and angle of visual field shift
   wherein the controller includes a memory that registers and holds electro-optical system setup parameters for irradiation with a beam tilted from a normal line on the sample as the charged particle beam.

9. The scanning charged particle beam device according to claim 8, wherein:
   device-induced astigmatism is corrected by the stigmator outside the objective lens and sample-induced astigmatism is corrected by the stigmator inside the objective lens.

10. The scanning charged particle beam device according to claim 8, wherein:
    the controller includes a memory which registers and holds electro-optical system setup parameters for irradiation with a beam tilted from a normal line on the sample as the charged particle beam, and a processing section which compares observation images obtained by the tilted beam and measures an amount and direction of movement and calculates an amount of astigmatism correction from the amount of movement and the direction.

11. The scanning charged particle beam device cccording to claim 10, wherein:
    the processing section compares observation images obtained by tilted beams in two trajectories with an azimuth angle of 45 degrees or 135 degrees with respect to a normal line on the sample and calculates the amount of movement.

12. The scanning charged particle beam device according to claim 10, wherein:
    the processing section calculates the amount of movement from tilted beams in two reference trajectories with an azimuth angle of 45 degrees or 135 degrees with respect to a normal line on the sample and two trajectories with the azimuth angle of 90 degrees or −90 degrees with respect to the reference trajectories.

13. The scanning charged particle beam device according to claim 10, wherein:
    under at least two focus conditions of the electro-optical system, the processing section obtains the amount of movement by tilted beams in two trajectories with an azimuth angle of 45 degrees or 135 degrees with respect to a normal line on the sample.

14. The scanning charged particle beam device according to claim 10, wherein:
    under at least two focus conditions of the electro-optical system, the processing section obtains the amount of movement by tilted beams in two reference trajectories with an azimuth angle of 45 degrees or 135 degrees with respect to a normal line on the sample and two trajectories with the azimuth angles of 90 degrees or −90 degrees with respect to the reference trajectories.

15. The scanning charged particle beam device according to claim 1, wherein:
the processing section calculates astigmatic differences from the amount of movement and the direction, and calculates an amount of astigmatism correction from the astigmatic differences.

16. The scanning charged particle beam device according to claim 8, wherein:
astigmatism on the sample attributable to an electrostatic charge distribution is corrected by the stigmator inside the objective lens.

17. A charged particle beam device using a charged particle beam, comprising:
a stage on which a sample is loaded;
a charged particle beam optical system that irradiates the sample on the stage with the charged particle beam and detects secondary charged particles generated from the sample; and
a controller that determines setup parameters for the charged particle beam optical system to control the charged particle beam optical system and obtains an image of the sample from the detected secondary charged particles;
wherein the controller includes a memory which registers and holds electro-optical system setup parameters for irradiation with a beam tilted from a normal line on the sample as the charged particle beam, and a processing section which measures an amount and angle of visual field shift due to parallax with comparing observation images obtained by the tilted beam at different azimuth angles by using an astigmatism calibration mark, and calculates an amount of astigmatism correction from the amount and angle of visual field shift and calculates an astigmatic difference from pattern edge sharpness in the image with using the astigmatism calibration mark.

* * * * *